(12) United States Patent
Mizoi

(10) Patent No.: US 6,215,098 B1
(45) Date of Patent: Apr. 10, 2001

(54) METHOD FOR MANUFACTURING A HOLDING TRAY FOR CHIP COMPONENTS

(75) Inventor: Akira Mizoi, Shiga-ken (JP)

(73) Assignee: Murata Manufacturing Co., Ltd., Nagaokakyo (JP)

( * ) Notice: Subject to any disclaimer, the term of this patent is extended or adjusted under 35 U.S.C. 154(b) by 0 days.

(21) Appl. No.: 09/347,268

(22) Filed: Jul. 6, 1999

(30) Foreign Application Priority Data

Jul. 16, 1998 (JP) ................................................. 10-201500

(51) Int. Cl.$^7$ ........................................................ B23K 26/00
(52) U.S. Cl. ........................................................ 219/121.71
(58) Field of Search .......................... 219/121.7, 121.71; 206/712, 716, 562

(56) References Cited

U.S. PATENT DOCUMENTS

| | | | |
|---|---|---|---|
| 3,226,527 | * 12/1965 | Harding | 219/121.7 |
| 3,524,046 | * 8/1970 | Brouwer | 219/121.7 |
| 3,742,182 | * 6/1973 | Saunders | 219/121.71 |
| 4,099,615 | * 7/1978 | Lemke et al. | 206/716 |
| 5,336,554 | * 8/1994 | Knight | 219/121.7 X |
| 5,337,893 | 8/1994 | Nami et al. | |

FOREIGN PATENT DOCUMENTS

| | | | |
|---|---|---|---|
| 2150038 | * 6/1985 | (GB) | . |
| 57-28693 | * 2/1982 | (JP) | 219/121.7 |
| 59-191583 | * 10/1984 | (JP) | 219/121.71 |
| 1-228692 | * 9/1989 | (JP) | 219/121.71 |
| 5-42123 | 6/1993 | (JP) | . |

* cited by examiner

Primary Examiner—Samuel M. Heinrich
(74) Attorney, Agent, or Firm—Burns, Doane, Swecker & Mathis, LLP

(57) ABSTRACT

A method for manufacturing a holding tray for chip components is provided in which residual stress in the elastic member does not affect accuracy in machining of the hole and a metallic mold is not required. The method for manufacturing a holding tray for chip components having a plurality of holding holes includes the steps of preparing a hard substrate including a frame portion, a flat board portion unitarily formed with the inner peripheral surfaces of the frame portion, and a plurality of through-holes formed on the flat board portion; forming an elastic member in a region surrounded by the frame portion of the hard substrate to cure it; and making therethrough holding holes smaller than the through-holes by means of laser machining at positions corresponding to those of the through-holes on the elastic member after curing of the elastic member.

2 Claims, 3 Drawing Sheets

METHOD FOR MANUFACTURING A HOLDING TRAY FOR CHIP COMPONENTS

BACKGROUND OF THE INVENTION

1. Field of the Invention

The present invention relates to a method for manufacturing a holding tray for chip components such as monolithic chip capacitors and chip resistors, and more specifically, relates to a manufacturing method for a holding tray used in processes of attaching terminals to chip components, measuring chip components, and so forth.

2. Description of the Related Art

Hitherto, a jig, being called "a holding tray", has been used for attaching terminals to chip components such as monolithic chip capacitors. The holding tray is provided with a hard substrate comprising a frame portion, a flat board portion unitarily formed with the inner peripheral surfaces of the frame portion, and a plurality of through-holes formed in the flat board portion. An elastic member is formed in a region surrounded by the frame portion of the hard substrate and holding holes having smaller diameters than those of the through-holes are made through on the elastic member at the positions corresponding to those of the through-holes.

A method for manufacturing the holding tray disclosed in Japanese Examined Patent Publication No. 5-42123 is known. That is, pins having diameters smaller than those of the through-holes are inserted into the through-holes formed in the flat portion of the prepared hard substrate so that liquid elastic material is poured on the hard substrate in a state in which pins are inserted. After the elastic material is cured, holding holes are formed by removing the pins. In the above-mentioned method, the holding holes are formed by molding the elastic material using a metallic mold having the pins.

In the above-mentioned method, molding is easy, however, there has been a problem in that accuracy in the position and dimensions of the holding hole is deteriorated by residual stress in the elastic member produced during molding. There are some cases in which flash is produced around the holding holes and it is disadvantageous to take time to remove the flash. It is a further disadvantage to make an expensive mold having a large number of pins and an extended production period.

SUMMARY OF THE INVENTION

Accordingly, the object of the present invention is to provide a method for manufacturing a holding tray for chip components in which residual stress in an elastic member does not affect the accuracy of making holes, and a metallic mold is not required.

In order to attain the above-mentioned object, in accordance with one aspect of the present invention, a method for manufacturing a holding tray comprises the steps of preparing a hard substrate including a frame portion, a flat board portion unitarily formed with the inner peripheral surfaces of the frame portion, and a plurality of through-holes formed on the flat board portion; forming an elastic member in a region surrounded by the frame portion of the hard substrate; and forming holding holes smaller than the through-holes by means of laser machining at areas in the elastic member, the positions of the holding holes corresponding to positions of the through-holes.

In the first place, a holding tray having no holding hole is manufactured by forming an elastic member on the hard substrate. As for a method for forming the elastic member, for example, after the hard substrate is positioned between upper and lower molds, the elastic member may be formed by curing liquid elastic material charged inside of the frame body; after an elastic material is positioned on one side surface or both side surfaces of the hard substrate, the elastic member may be unitarily formed with the hard substrate by embedding the elastic material inside the frame body by means of a hot-press. After forming the elastic member, a holding hole is made therethrough by irradiating the corresponding position to that of the through-hole on the elastic member with a laser beam so that the local area is burned off. Since the laser beam has an extremely large amount of energy at that time, limited and deep machining can be performed, so that the holding hole can be simply formed without flash. Therefore, residual stress is not generated around the holding hole which is different from the situation of molding; moreover, since the region beyond the required area is not burned off, accuracy in the position and dimensions of the holding hole is not deteriorated.

As for methods for laser machining on the elastic member, for example, the holding hole may be formed using a laser beam having approximately the same diameter as that of the holding hole machining may be performed after forming a beam shape using a mask. It may be preferable that the holding hole be machined by turning around of a laser beam having a smaller diameter than that of the holding hole. That is, the laser beam diameter may be reduced to be as small as possible, so that the inner surface of the holding hole is more neatly machined, resulting higher accuracy in hole diameter.

In addition, in accordance with the present invention, a pulse-oscillating $CO_2$ laser among YAG, $CO_2$ lasers, etc., is preferable, by which it is difficult to thermally affect materials.

DESCRIPTION OF THE PREFERRED EMBODIMENTS

Figure 1:
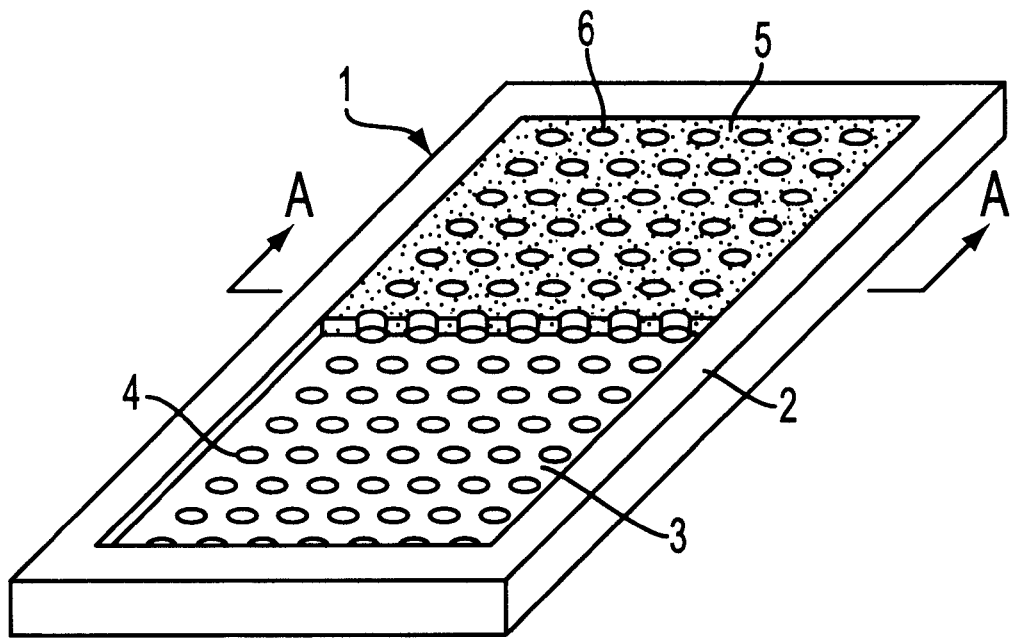
FIG. 1 is a partially cutaway schematic view of an elastic member of a holding tray according to an embodiment of the present invention.
Figure 2:
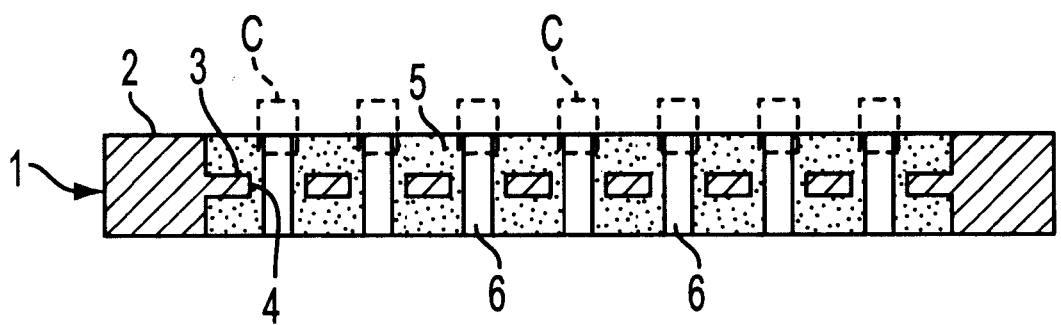
FIG. 2 is a sectional view at the line A—A of FIG. 1.

FIGS. 1 and 2 show an example of a holding tray according to the present invention.

In the drawings, a hard substrate 1, formed of a metal such as aluminum, includes a frame portion 2 having a square contour, a flat board portion 3 unitarily formed with the inner peripheral surfaces of the frame portion 2 over the entire inner region of the frame portion 2 in a roughly middle stage in the thickness direction thereof, and a plurality of through-holes 4 formed on the flat board portion 3 lengthwise and breadthwise. An elastic member 5 such as a silicone rubber is charged in a region surrounded by the frame portion 2 of the above-mentioned hard substrate 1. Therefore, the elastic members 5 disposed on a front side and on a back side of the flat board portion 3 are connected to each other via the through-holes 4. A holding hole 6 made therethrough for a chip component is formed by penetrating the through-hole 4 of the elastic bodies 5. In this embodiment, the through-hole 4 and the holding hole 6 are circular-shaped in cross-section together, however, the invention is not limited to this shape.

As shown in FIG. 2, the chip component C is elastically held by the holding hole 6 in a state in which one end of the component protrudes from the surface of the holding tray.

A manufacturing method for the holding tray formed as described above will now be described.

Figure 3:
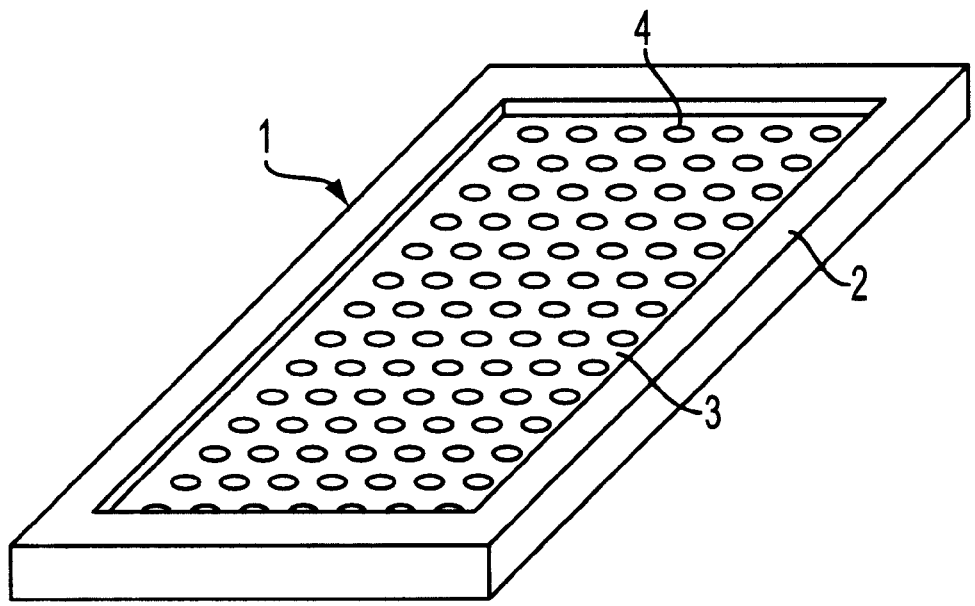
FIG. 3 is a schematic view of a hard substrate.
Figure 4:
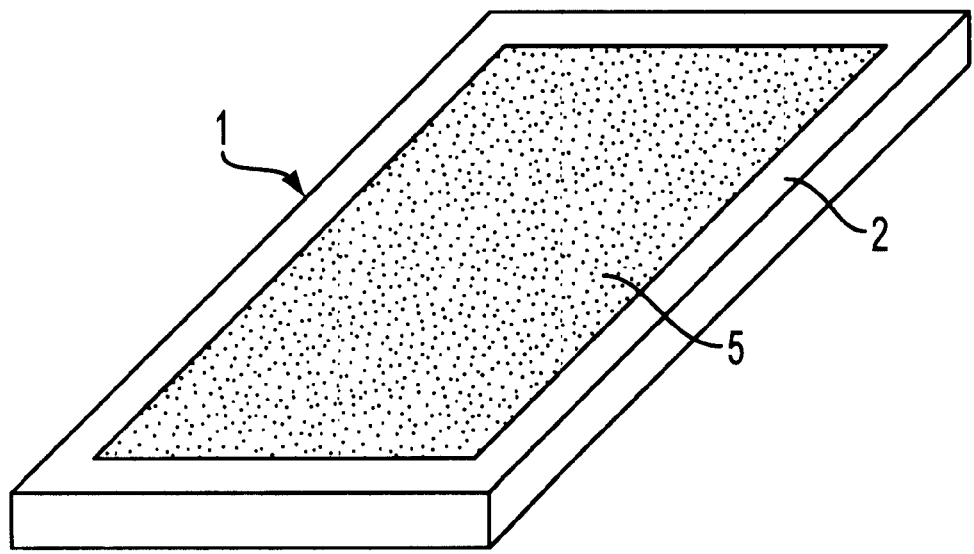
FIG. 4 is a schematic view of the hard substrate filled with the elastic member.

The hard substrate 1 in the shape shown in FIG. 3 is formed by machining, etc. firstly. Then the above-mentioned hard substrate 1 is positioned into a metallic mold (not shown) so that the region surrounded by the frame portion 2 of the hard substrate 1 is charged with elastic material liquid 5, to form the elastic member 5. They are next placed into a curing furnace together with the metallic mold so that the elastic member 5 is heated and cured. The holding tray in this state is shown in FIG. 4. In this state, the holding hole 6 is not yet formed on the elastic member 5.

Figure 5:
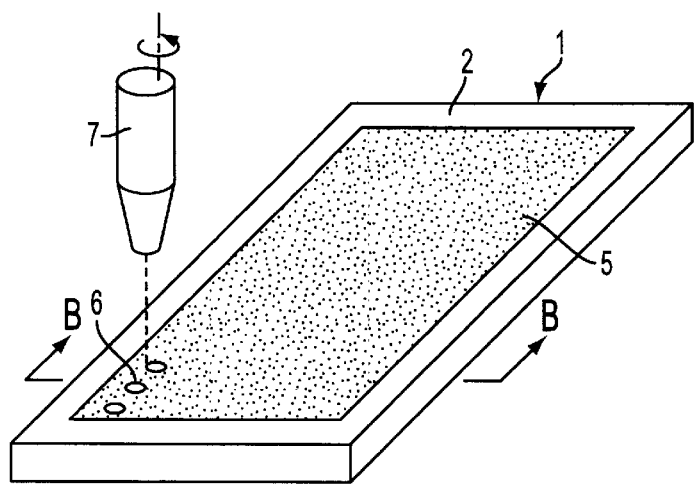
FIG. 5 is a schematic view of the hard substrate shown in FIG. 4 in a state of being irradiated with a laser beam.
Figure 6:
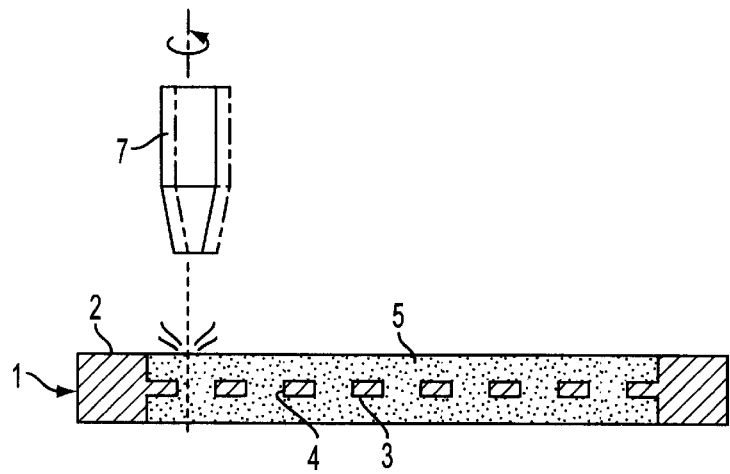
FIG. 6 is a sectional view at the line B—B of FIG. 5.
Figure 7:
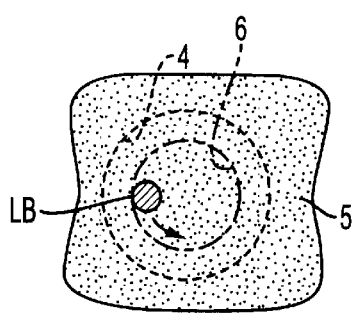
FIG. 7 is a partial plan view of the hard substrate shown in FIG. 5.

The holding hole 6 having a smaller diameter than that of the through-hole 4 is then made therethrough at the position corresponding to that of the through-hole 4 using a laser-machining apparatus 7 as shown in FIGS. 5 and 6. The laser-machining apparatus 7 generates a laser beam "LB" having a smaller diameter than the inner diameter of the holding hole 6, as shown in FIG. 7, and the holding hole 6 is machined by turning the laser beam "LB" around in the direction of the arrow. Therefore, the holding hole 6 can be formed by burning off a small volume by the laser beam "LB", so that the inner surface of the holding hole 6 can be more neatly machined.

When the holding hole 6 is machined, the laser-machining apparatus 7 may be turned around while holding it in a vertical position or it may be turned around by a precessional movement using a point at an upper portion of the laser-machining apparatus 7 as the supporting point thereof.

The present invention is not limited to the above-described embodiment and various modifications can be made without departing from the spirit and scope of the present invention.

For example, although in the above-described embodiment, circular-shaped through-hole 4 and holding holes 6 are described as examples, the invention is not limited to those, and a hole of any shape such as a square or an oval-shaped hole may be made.

The beam diameter of the laser beam is not necessarily smaller than that of the holding hole 6 as shown in FIG. 7; it may be the same as that of the holding hole 6. When the holding hole 6 is oval-shaped, the holding hole 6 may be formed by moving the beam having the same diameter as the breadth of the holding hole 6 in the direction of the length of the hole.

The flat board portion 3 of the hard substrate 1 is formed in the middle stage of the frame portion 2 in the thickness direction thereof, or it may be formed on one side surface of the frame portion 2. In this case, the elastic member 5 is only formed on the other side surface of the hard substrate 1.

The hard substrate forming the holding tray is not always a metal; it may be formed of a plastic.

In the above-described embodiment, the inside of the frame portion of is filled with elastic member liquid using a metallic mold; it may be performed by another method such as a hot-press method as a matter of course.

As will be clear from the foregoing description, in accordance with the one aspect of the present invention, since the holding holes are subsequently made using a laser after forming the elastic member, residual stress generated in the elastic member during formation does not adversely affect the accuracy in machining of the holding hole and flash cannot be produced around the holding holes.

Since a metallic mold having a large number of pins is not required as in a conventional manufacturing method, cost for making a metallic mold can be reduced and a manufacturing period for the metallic mold can also be made unnecessary. This results in simple manufacturing of a holding tray corresponding to a number of items of chip components.

What is claimed is:

1. A method for manufacturing a holding tray having holding holes for elastically holding a plurality of chip components, said method comprising the steps of:

preparing a hard substrate including a frame portion, a flat board portion unitarily formed with the inner peripheral surfaces of the frame portion, and a plurality of through-holes formed on the flat board portion;

forming an elastic member in a region surrounded by the frame portion of the hard substrate; and forming holding holes smaller than the through-holes by laser machining at areas in the elastic member, positions of the holding holes corresponding to the positions of the through-hole after said step of forming an elastic member.

2. A method according to claim 1, wherein said forming holding holes step is performed by turning around of a laser beam having a smaller diameter than an inner diameter of the holding hole.

\* \* \* \* \*